United States Patent
Sakai

(10) Patent No.: US 10,727,795 B2
(45) Date of Patent: Jul. 28, 2020

(54) AMPLIFIER CIRCUIT THAT AMPLIFIES DIFFERENTIAL SIGNAL AND OPTICAL MODULE THAT INCLUDES AMPLIFIER CIRCUIT

(71) Applicant: FUJITSU LIMITED, Kawasaki-shi, Kanagawa (JP)

(72) Inventor: Yasufumi Sakai, Fuchu (JP)

(73) Assignee: FUJITSU LIMITED, Kawasaki (JP)

( * ) Notice: Subject to any disclaimer, the term of this patent is extended or adjusted under 35 U.S.C. 154(b) by 197 days.

(21) Appl. No.: 15/922,973

(22) Filed: Mar. 16, 2018

(65) Prior Publication Data

US 2018/0316325 A1 Nov. 1, 2018

(30) Foreign Application Priority Data

Apr. 27, 2017 (JP) .................................. 2017-088533

(51) Int. Cl.
*H03F 3/45* (2006.01)
*H03F 1/02* (2006.01)
(Continued)

(52) U.S. Cl.
CPC ....... *H03F 3/45215* (2013.01); *H03F 1/0216* (2013.01); *H03F 1/0261* (2013.01); *H03F 1/086* (2013.01); *H03F 3/082* (2013.01); *H03F 3/45381* (2013.01); *H04B 10/516* (2013.01); *H03F 2200/21* (2013.01);
(Continued)

(58) Field of Classification Search
CPC ...... H03F 3/45215; H03F 1/086; H03F 3/082; H03F 3/45381; H03F 1/0261; H03F 1/0216; H03F 2200/555; H03F 2203/45702; H03F 2203/45022; H03F 2203/45178; H03F 2203/45674; H03F 2200/21;
(Continued)

(56) References Cited

U.S. PATENT DOCUMENTS

| 8,803,611 B2 * | 8/2014 | Chen ........................ H03F 1/34 330/260 |
| 2007/0152752 A1 | 7/2007 | Oishi |
| 2014/0241659 A1 * | 8/2014 | Fukuda ................. G02F 1/0121 385/3 |

FOREIGN PATENT DOCUMENTS

| JP | 09-74338 | 3/1997 |
| JP | 2001-185964 | 7/2001 |
| JP | 2007-184688 | 7/2007 |

* cited by examiner

*Primary Examiner* — Khanh V Nguyen
*Assistant Examiner* — Khiem D Nguyen
(74) *Attorney, Agent, or Firm* — Fujitsu Patent Center

(57) ABSTRACT

An amplifier circuit includes: an amplifier; and a bias circuit that controls an operation point of the amplifier. The amplifier includes: a load resistor; a differential transistor pair electrically coupled to the load resistor; and a tail transistor electrically coupled to the differential transistor pair. The bias circuit includes: a voltage generator circuit that generates a reference voltage corresponding to a sum of a threshold voltage of a transistor in the differential transistor pair and a saturation drain voltage of the tail transistor; and a current generator circuit that generates a reference current that is proportional to a difference between a power supply voltage of the amplifier circuit and the reference voltage by using a reference resistor. The current generator circuit is electrically coupled to the amplifier such that a tail current that flows through the tail transistor is proportional to the reference current.

10 Claims, 14 Drawing Sheets

(51) Int. Cl.
*H04B 10/516* (2013.01)
*H03F 1/08* (2006.01)
*H03F 3/08* (2006.01)
*H04B 10/40* (2013.01)

(52) U.S. Cl.
CPC .............. *H03F 2200/555* (2013.01); *H03F 2203/45022* (2013.01); *H03F 2203/45151* (2013.01); *H03F 2203/45154* (2013.01); *H03F 2203/45178* (2013.01); *H03F 2203/45674* (2013.01); *H03F 2203/45702* (2013.01); *H04B 10/40* (2013.01)

(58) Field of Classification Search
CPC . H03F 2203/45151; H03F 2203/45154; H04B 10/516; H04B 10/40
USPC ................................................ 330/252–261
See application file for complete search history.

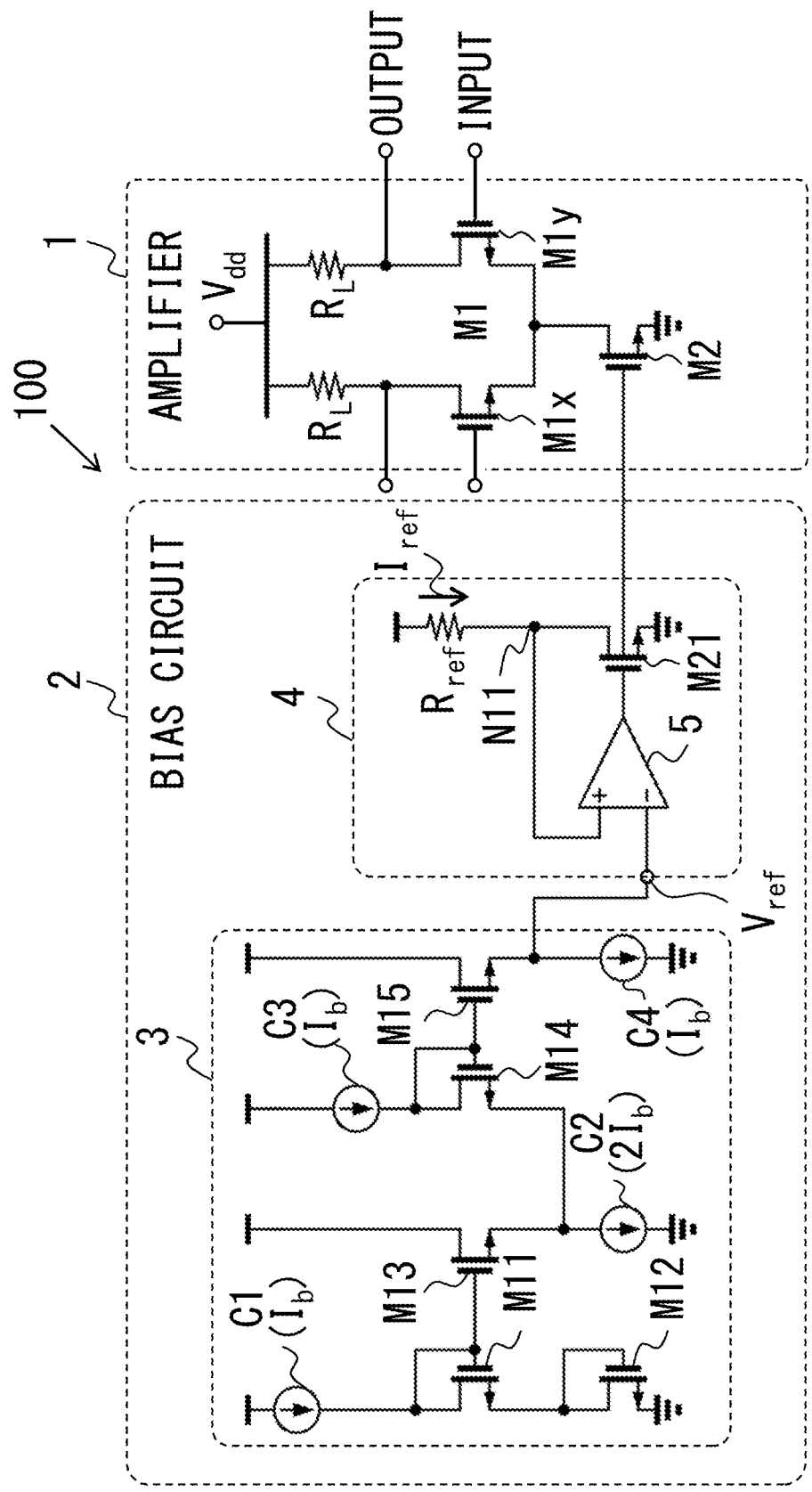
F I G. 2

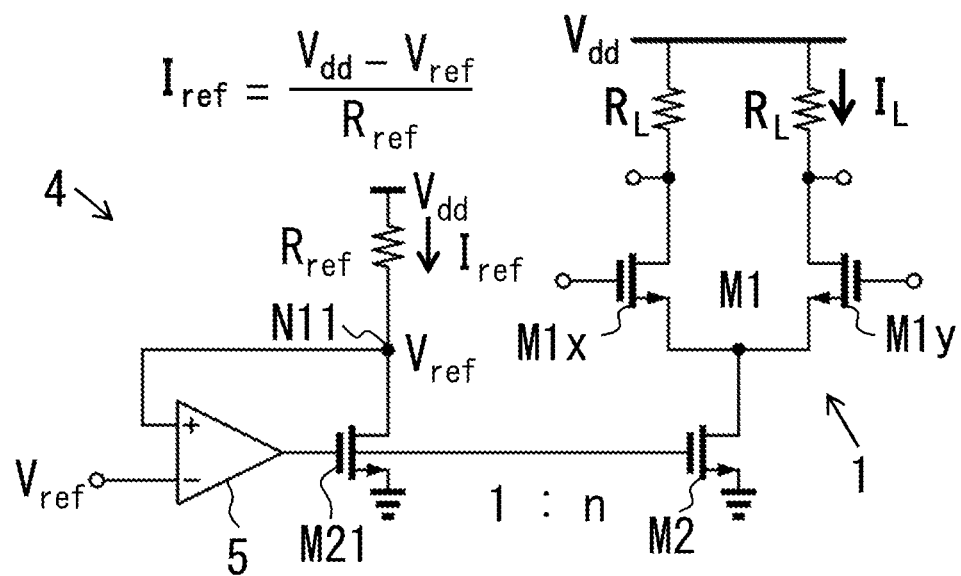
F I G. 3

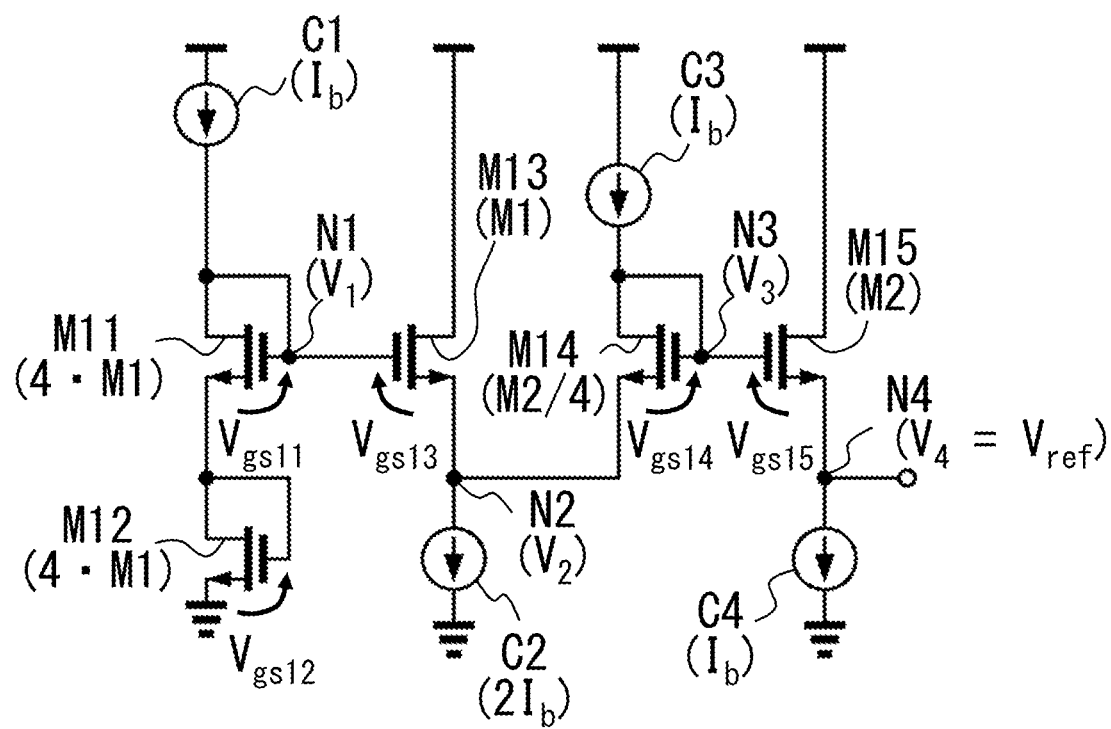
F I G. 4

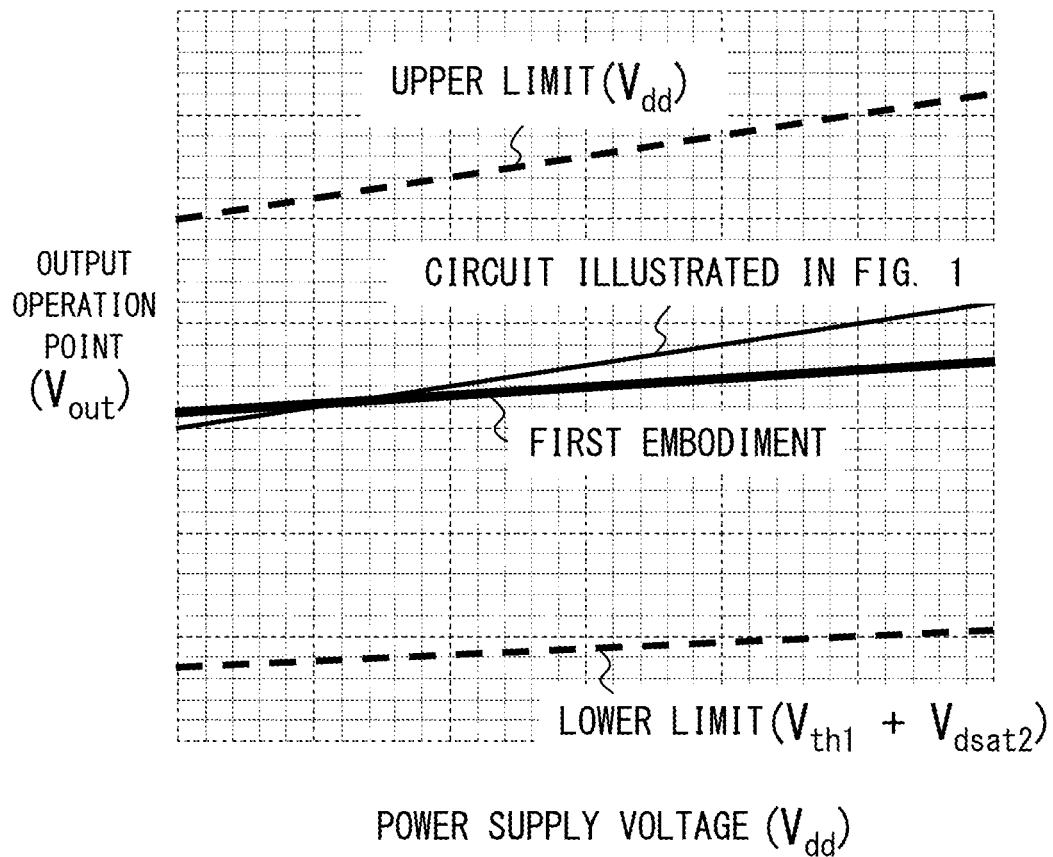
F I G. 5

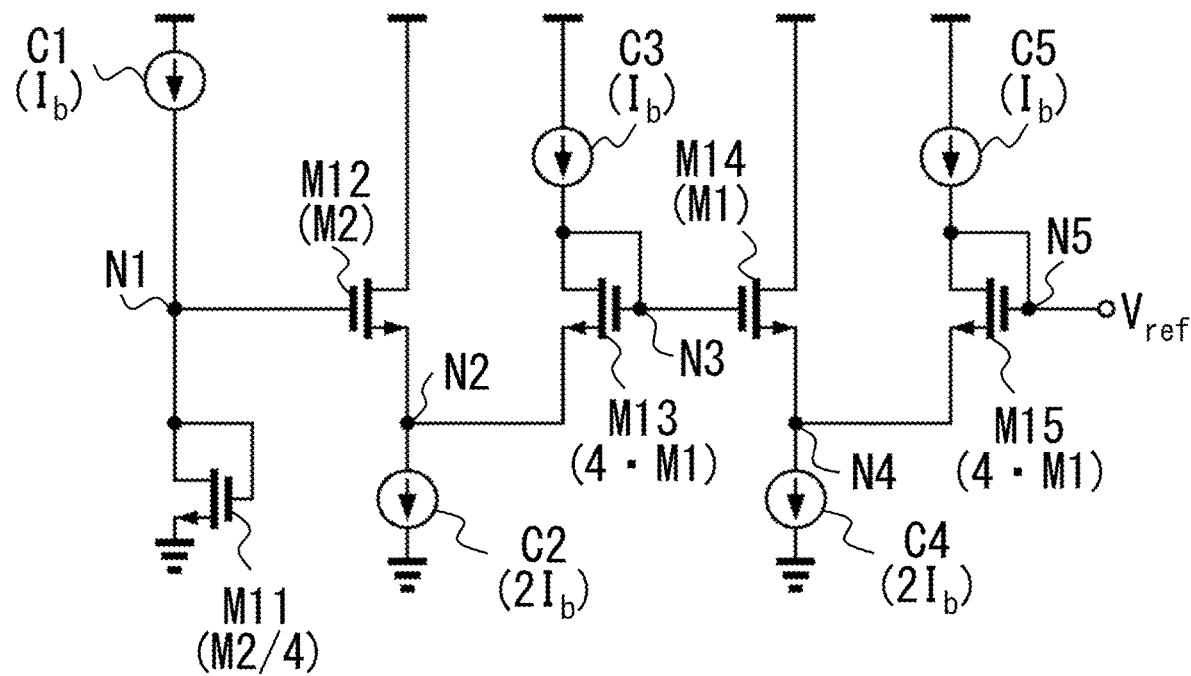
F I G. 6

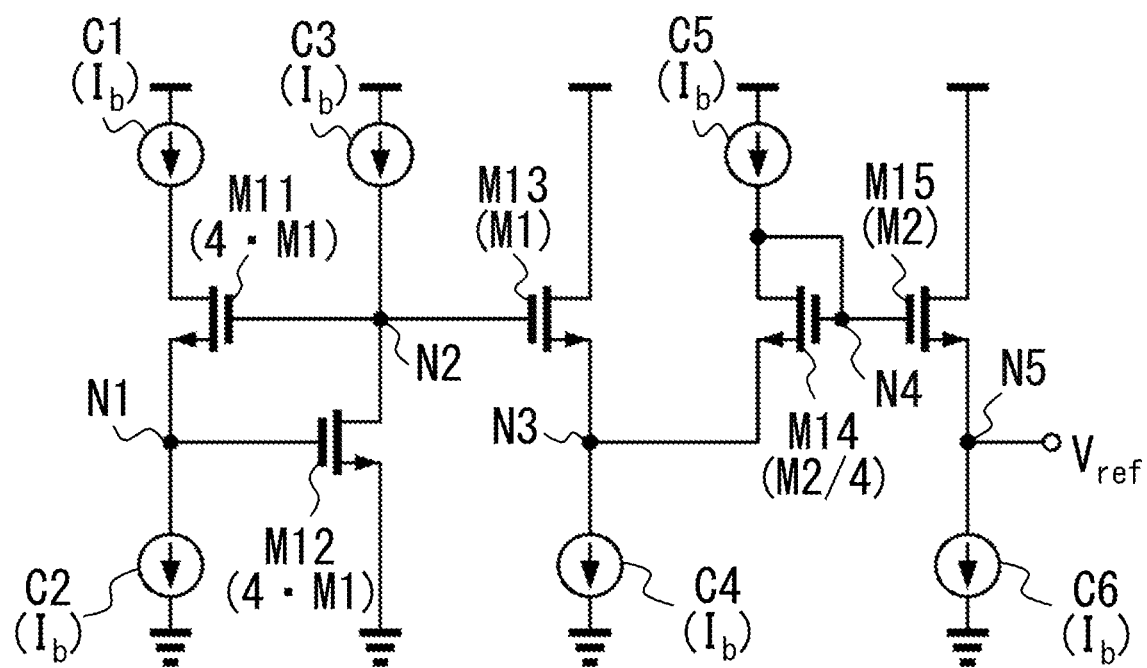
F I G. 7

AMPLIFIER CIRCUIT THAT AMPLIFIES DIFFERENTIAL SIGNAL AND OPTICAL MODULE THAT INCLUDES AMPLIFIER CIRCUIT

CROSS-REFERENCE TO RELATED APPLICATION

This application is based upon and claims the benefit of priority of the prior Japanese Patent Application No. 2017-088533, filed on Apr. 27, 2017, the entire contents of which are incorporated herein by reference.

FIELD

The embodiments discussed herein are related to an amplifier circuit that amplifies a differential signal and an optical module equipped with the amplifier circuit.

BACKGROUND

Resistor load differential amplifiers that include a load resistor, a differential transistor pair and a tail current source are known as an example of amplifiers used for high-speed data communications. The operation point of a resistor load differential amplifier is controlled by using the bias circuit. However, when an amplifier is formed on an integrated circuit, the characteristics of the circuit elements, such as transistors, resistors, etc., included in the amplifier may have variations. Thus, it is demanded that the bias circuit can control the operation point of an amplifier appropriately even when the characteristics of the circuit elements on the integrated circuit have variations.

FIG. 1 illustrates an example of an amplifier circuit that amplifies a differential signal. Note that the amplifier illustrated in FIG. 1 is a resistor load differential amplifier, and includes load resistors $R_L$, differential transistor pair M1 and tail transistor M2.

The bias circuit generates a current that depends upon the resistance value of resistor $R_{ref}$. In other words, the voltage of node N illustrated in FIG. 1 is maintained at $V_{ref}$ through negative feedback. In such a case, current $I_{ref}$ which flows through resistor $R_{ref}$ is $V_{ref}/R_{ref}$. When it is assumed that the current ratio between transistors M51 and M52 is 1:1, the current that flows through transistor M53 is $I_{ref}$. Also, when it is assumed that the current ratio between transistors M53 and M2 is 1:2, the current that flows through transistor M2 is $2I_{ref}$. Accordingly, the current that flows through each of the transistors in differential transistor pair M1 is $I_{ref}$. In such a case, operation point $V_{out}$ of this amplifier is expressed by Formula 1. In the formula, $V_{dd}$ represents a power supply voltage.

$$V_{out} = V_{dd} - I_{ref} R_L \qquad (1)$$
$$= V_{dd} - \frac{R_L}{R_{ref}} V_{ref}$$

As described above, operation point $V_{out}$ of an amplifier is determined based on the ratio between resistor $R_L$ and resistor $R_{ref}$. When the resistance value of for example resistor $R_L$ becomes higher than a target value because of manufacturing variations, the resistance value of resistor $R_{ref}$ also becomes higher at the same ratio. In other words, the ratio between resistor $R_L$ and resistor $R_{ref}$ does not depend upon manufacturing variations. Thus, the operation point of an amplifier can be configured without depending upon the manufacturing variations.

Note that differential amplifiers and circuits that control differential amplifiers are disclosed by for example Japanese Laid-open Patent Publication No. 2001-185964, Japanese Laid-open Patent Publication No. 2007-184688 and Japanese Laid-open Patent Publication No. 9-74338.

As described above, the operation point of an amplifier can be configured without depending upon the manufacturing variations. However, it is not easy to stably maximize the amplitudes of output signals of amplifiers by using the conventional techniques. For example, operation point $V_{out}$, which is expressed by Formula 2, is needed in order to maximize the amplitudes of output signals in the resistor load differential amplifier illustrated in FIG. 1. $V_{dd}$ represents a power supply voltage. $V_{th1}$ represents the threshold voltage of each of the transistors in differential transistor pair M1. $V_{dsat2}$ represents the saturation drain voltage of tail transistor M2.

$$V_{out} = V_{dd} - \frac{1}{2}\{V_{dd} - (V_{th1} + V_{dsat2})\} \qquad (2)$$

As described above, the operation point that leads to the maximum amplitudes of output signals depends upon the characteristics of differential transistor pair M1 and tail transistor M2. Accordingly when the characteristics of transistors vary due to manufacturing variations, the conventional techniques, in which operation points are configured based on resistance ratios, fail to compensate for the variations in the characteristics of transistors. In other words, the conventional techniques sometimes fail to maximum the amplitudes of output signals of amplifiers.

SUMMARY

According to an aspect of the present invention, an amplifier circuit includes: an amplifier; and a bias circuit configured to control an operation point of the amplifier. The amplifier includes: a load resistor; a differential transistor pair electrically coupled to the load resistor; and a tail transistor electrically coupled to the differential transistor pair. The bias circuit includes: a voltage generator circuit configured to generate a reference voltage corresponding to a sum of a threshold voltage of a transistor in the differential transistor pair and a saturation drain voltage of the tail transistor; and a current generator circuit configured to generate a reference current that is proportional to a difference between a power supply voltage of the amplifier circuit and the reference voltage by using a reference resistor. The current generator circuit is electrically coupled to the amplifier such that a tail current that flows through the tail transistor is proportional to the reference current.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 2 illustrates an example of an amplifier circuit according to the first embodiment of the present invention;

FIG. 3 illustrates an example of control of the operation point of an amplifier;

FIG. 4 illustrates an operation example of a voltage generator circuit according to the first embodiment;

FIG. 5 illustrates an example of an effect of the first embodiment;

FIG. 6 illustrates an example of a voltage generator circuit included in an amplifier circuit according to the second embodiment;

FIG. 7 illustrates an example of a voltage generator circuit included in an amplifier circuit according to the third embodiment;

DESCRIPTION OF EMBODIMENTS

First Embodiment

Figure 1:
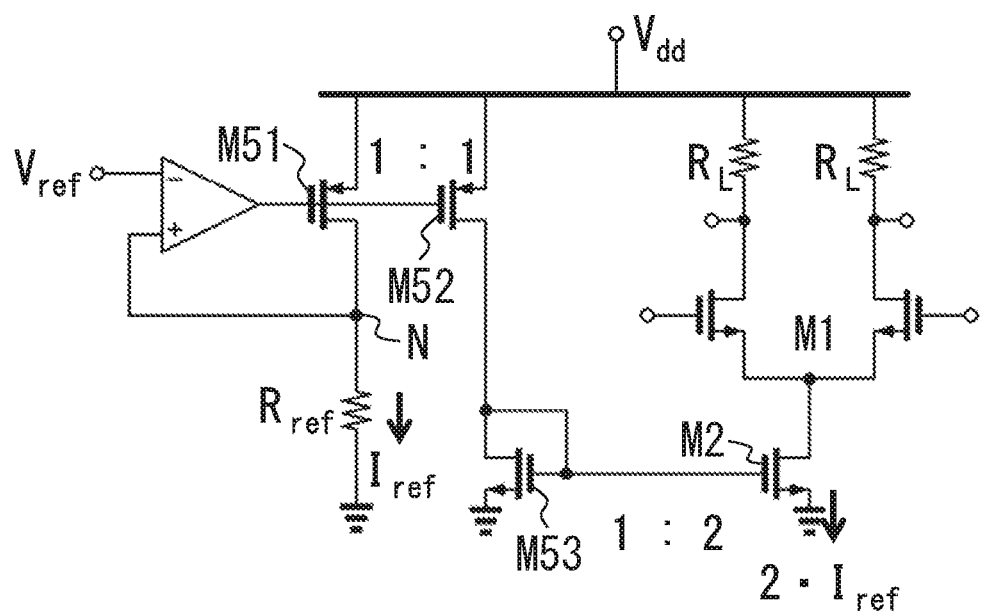
FIG. 1 illustrates an example of an amplifier circuit that amplifies a differential signal.

FIG. 2 illustrates an example of an amplifier circuit according to the first embodiment of the present invention. An amplifier circuit 100 according to the first embodiment includes an amplifier 1 and a bias circuit 2. The bias circuit 2 includes a voltage generator circuit 3 and a current generator circuit 4. The amplifier circuit 100 is connected to power supply $V_{dd}$. In other words, power supply voltage $V_{dd}$ is applied to the amplifier 1, the voltage generator circuit 3 and the current generator circuit 4.

The amplifier 1 is a resistor load differential amplifier that is provided with load resistors $R_L$, differential transistor pair M1 and tail transistor M2. Differential transistor pair M1 includes transistors M1x and M1y. Transistors M1x and M1y have characteristics that are substantially identical to each other. The drains of respective transistors M1x and M1y are connected to power supply $V_{dd}$ via load resistors $R_L$. The sources of respective transistors M1x and M1y are connected to the drain of tail transistor M2. The source of tail transistor M2 is grounded. The gate of tail transistor M2 is connected to the bias circuit 2. The amplifier 1 amplifies input signals that are supplied to the gates of differential transistor pair M1.

The voltage generator circuit 3 includes current sources C1 through C4 and transistors M11 through M15. The drain of transistor M11 is connected to current source C1. In this example, the current generated by current source C1 is $I_b$. The source of transistor M11 is connected to the drain of transistor M12. The source of transistor M12 is grounded. In each of transistors M11 and M12, the drain and the gate are connected to each other. In other words, transistors M11 and M12 respectively operate as diodes.

The gate of transistor M13 is connected to the gate of transistor M11. Voltage $V_{dd}$ is applied to the drain of transistor M13. The source of transistor M13 is grounded via current source C2. In this example, the current generated by current source C2 is $2I_b$.

The drain of transistor M14 is connected to current source C3. In this example, the current generated by current source C3 is $I_b$. The source of transistor M14 is grounded via current source C2. In transistor M14, the drain and the gate are connected to each other. In other words, transistor M14 operates as a diode.

The gate of transistor M15 is connected to the gate of transistor M14. Voltage $V_{dd}$ is applied to the drain of transistor M15. The source of transistor M15 is grounded via current source C4. In this example, the current generated by current source C4 is $I_b$. The voltage generator circuit 3 outputs the voltage of the source of transistor M15. Note that an output voltage of the voltage generator circuit 3 may be referred to as a "reference voltage $V_{ref}$" in the descriptions below.

The current generator circuit 4 includes reference resistor $R_{ref}$, an amplifier 5 and a transistor M21. The noninverting terminal of the amplifier 5 is connected to power supply $V_{dd}$ via reference resistor $R_{ref}$. Reference voltage $V_{ref}$ generated by the voltage generator circuit 3 is supplied to the inverting terminal of the amplifier 5. The output terminal of the amplifier 5 is connected to the gate of transistor M21. The drain of transistor M21 is connected to the noninverting terminal of the amplifier 5. The source of transistor M21 is grounded. In this configuration, the voltage of node N11 is maintained at $V_{ref}$ through negative feedback. Thus the current generator circuit 4 generates reference current $I_{ref}$, which depends upon reference resistor $R_{ref}$ and reference voltage $V_{ref}$.

The gate of transistor M21 is connected to the gate of tail transistor M2 of the amplifier 1. Also, the source of transistor M21 and the source of tail transistor M2 are grounded to an equal potential. As a result of this, transistor M21 and tail transistor M2 have an equal gate-source voltage, and accordingly the current that flows through tail transistor M2 is proportional to the current that flows through transistor M21. In other words, a current that is proportional to reference current $I_{ref}$ flows through tail transistor M2.

Note that while current sources C1 through C4 are included in the voltage generator circuit 3 in the example illustrated in FIG. 2, the first embodiment is not limited to that configuration. Specifically, current sources C1 through C4 may be provided outside the voltage generator circuit 3.

It is assumed that the transistors constituting differential transistor pair M1 operate in a saturated region in the amplifier circuit 100. Also, the operation point of the amplifier 1 is set such that the amplitude of an output signal of the amplifier 1 is maximized. In such a case, operation point $V_{out}$ that leads to the maximum amplitude of an output signal of the amplifier 1 is expressed by Formula 3. Note that $V_{dd}$ represents a power supply voltage. $V_{th1}$ represents the threshold voltage of each of the transistors constituting differential transistor pair M1. $V_{dsat2}$ represents the saturation drain voltage of tail transistor M2.

$$V_{out} = V_{dd} - \frac{1}{2}\{V_{dd} - (V_{th1} + V_{dsat2})\} \tag{3}$$

In this configuration, reference voltage $V_{ref}$ generated by the voltage generator circuit 3 is supplied to the current generator circuit 4 as illustrated in FIG. 3. In such a case, the voltage of node N11 is maintained at $V_{ref}$ through negative feedback. Accordingly, reference current $I_{ref}$ generated by the current generator circuit 4 is expressed by Formula 4.

$$I_{ref} = \frac{V_{dd} - V_{ref}}{R_{ref}} \qquad (4)$$

Further, when the size ratio between transistor M21 and tail transistor M2 is 1:n, the current that flows through tail transistor M2 is $n \times I_{ref}$. In this situation, equal currents respectively flow through transistors M1x and M1y, which constitute differential transistor pair M1. Thus, the current that flows through each load resistor $R_L$ is $n \times I_{ref}/2$. Accordingly, operation point $V_{out}$ is expressed by Formula 5.

$$\begin{aligned} V_{out} &= V_{dd} - I_L R_L \\ &= V_{dd} - \frac{n}{2} I_{ref} R_L \\ &= V_{dd} - \frac{n}{2} \cdot \frac{R_L}{R_{ref}} (V_{dd} - V_{ref}) \end{aligned} \qquad (5)$$

According to formulas (3) and (5), requirement 1 and requirement 2 respectively expressed by Formula 6 and Formula 7 below need to be satisfied in order to maximize the amplitude of an output signal of the amplifier 1.

$$\text{Rquirement 1: } \frac{n}{2} \cdot \frac{R_L}{R_{ref}} = \frac{1}{2} \qquad (6)$$

$$\text{Requirement 2: } V_{ref} = V_{th1} + V_{dsat2} \qquad (7)$$

Requirement 1 is satisfied when the resistance value of reference resistor $R_{ref}$, the resistance value of load resistor $R_L$ and the size ratio between transistor M21 and tail transistor M2 are configured appropriately. When size ratio n is "1" for example, reference resistor $R_{ref}$ and load resistors $R_L$ are formed such that the resistance value of reference resistor $R_{ref}$ and the resistance value of each load resistor $R_L$ are equal to each other. Alternatively, when size ratio n is "2", reference resistor $R_{ref}$ and load resistors $R_L$ are formed such that the resistance value of reference resistor $R_{ref}$ is twice as high as that of each load resistor $R_L$.

Requirement 2 is satisfied by generating $V_{th1} + V_{dsat2}$ as reference voltage $V_{ref}$ in the voltage generator circuit 3. In other words, when resistors and transistors are formed such that requirement 1 is satisfied and $V_{th1} + V_{dsat2}$ is generated in the voltage generator circuit 3, the operation point leading to the maximum amplitude of an output signal of the amplifier 1 is realized.

Next, by referring to FIG. 4, an operation in which the voltage generator circuit 3 generates $V_{th1} + V_{dsat2}$ will be described. Note in the descriptions below that each of the transistors constituting differential transistor pair M1 may also be referred to as "transistor M1".

The saturation drain voltage of a transistor depends upon the size of that transistor. Specifically, saturation drain voltage $V_{dsat}$ of a transistor is expressed by Formula 8. L represents a channel length. W represents a gate width. μ represents the effective mobility of carriers. $C_{OX}$ represents an oxide film capacitor.

$$V_{dsat} = \sqrt{\frac{2I}{\frac{W}{L} \mu C_{OX}}} \qquad (8)$$

In Formula 8, the size of the transistor is represented by "W/L". Therefore, when the size of the transistor is increased to four times, saturation drain voltage $V_{dsat}$ is decreased to half. Also, when the size of the transistor is reduced to one fourth, saturation drain voltage $V_{dsat}$ is increased to twice.

In this example, the size of each of transistors M11 and M12 is four times as large as that of transistor M1 as illustrated in FIG. 4. For example, the gate width of each of transistors M11 and M12 is four times as large as that of transistor M1. In such a case, the saturation drain voltage of each of transistors M11 and M12 is half as high as that of transistor M1. Accordingly, voltage $V_1$ of node N1 is expressed by Formula 9. $V_{gs11}$ represents the gate-source voltage of transistor M11. $V_{gs12}$ represents the gate-source voltage of transistor M12. $V_{th1}$ represents the threshold voltage of transistor M1. $V_{dsat1}$ represents the saturation drain voltage of transistor M1.

$$\begin{aligned} V_1 &= V_{gs11} + V_{gs12} \\ &= \left(V_{th1} + \frac{1}{2} V_{dsat1}\right) + \left(V_{th1} + \frac{1}{2} V_{dsat1}\right) \\ &= 2V_{th1} + V_{dsat1} \end{aligned} \qquad (9)$$

The size of transistor M13 is equal to that of transistor M1. In this configuration, the voltage of node N2 is equivalent to an output voltage of a source follower formed by transistor M13. Accordingly, voltage $V_2$ of node N2 is expressed by Formula 10. Note that $V_{gs13}$ represents the gate-source voltage of transistor M13.

$$\begin{aligned} V_2 &= V_1 - V_{gs13} \\ &= 2V_{th1} + V_{dsat1} - (V_{th1} + V_{dsat1}) \\ &= V_{th1} \end{aligned} \qquad (10)$$

The size of transistor M14 is one fourth as large as that of tail transistor M2. Accordingly, voltage $V_3$ of node N3 is expressed by Formula 11. Note that $V_{gs14}$ represents the gate-source voltage of transistor M14.

$$\begin{aligned} V_3 &= V_2 + V_{gs14} \\ &= V_{th1} + V_{th2} + 2V_{dsat2} \end{aligned} \qquad (11)$$

The size of transistor M15 is equal to that of tail transistor M2. Accordingly, voltage $V_4$ of node N4 is expressed by Formula 12. Note that $V_{gs15}$ represents the gate-source voltage of transistor M15.

$$V_{ref} = V_3 - V_{gs15} \quad (12)$$
$$= V_{th1} + V_{th2} + 2V_{dsat2} - (V_{th2} + V_{dsat2})$$
$$= V_{th1} + V_{dsat2}$$

As described above, $V_{th1}+V_{dsat2}$ is generated at node N4. Then, the voltage generator circuit 3 outputs the voltage of node N4 as reference voltage $V_{ref}$. As illustrated in FIG. 2 or FIG. 3, this reference voltage $V_{ref}$ is supplied to the current generator circuit 4. Then, the current generator circuit 4 generates reference current $I_{ref}$, which is expressed by Formula 4 above.

In this configuration, reference resistor $R_{ref}$ load resistors $R_L$, transistor M21 and tail transistor M2 are formed such that requirement 1, expressed by Formula 6 above, is satisfied. Thereby, the amplifier 1 can amplify an input signal at operation point $V_{out}$, which is expressed by Formula 3 above. In other words, the amplifier 1 can amplify the input signal such that the amplitude of an output signal is maximized.

FIG. 5 illustrates an example of an effect of the first embodiment. Now, the circuit illustrated in FIG. 1 and the circuit according to the first embodiment illustrated in FIG. 2 are compared. The horizontal axis represents power supply voltage $V_{dd}$ while the vertical axis represents voltage $V_{out}$ of operation point. Also, in the circuits illustrated in FIG. 1 and FIG. 2, the upper limit of the signal range of the amplifier 1 is power supply voltage $V_{dd}$ and the lower limit of the signal range is $V_{th1}+V_{dsat2}$.

In the example illustrated in FIG. 5, output operation points of the amplifier 1 with respect to changes in power supply voltages $V_{dd}$ are illustrated. In order to maximize the amplitude of an output signal of the amplifier 1, operation point $V_{out}$ needs to be at the midpoint between $V_{dd}$ and $V_{th1}+V_{dsat2}$. However, in the circuit illustrated in FIG. 1, a change in power supply voltage $V_{dd}$ will shift operation point $V_{out}$ from the midpoint of the signal range because reference voltage $V_{ref}$ is constant. In the example illustrated in FIG. 5, in a region with higher power supply voltages $V_{dd}$, a difference between operation point $V_{out}$ and lower limit voltage is greater than a difference between operation point $V_{out}$ and upper limit voltage.

By contrast, in the circuit according to the first embodiment illustrated in FIG. 2, reference voltage $V_{ref}$ supplied to the current generator circuit 4 is controlled to be $V_{th1}+V_{dsat2}$. In other words, reference voltage $V_{ref}$ is controlled to be equal to the lower limit voltage of the signal range of the amplifier 1. Accordingly, even when power supply voltage $V_{dd}$ changes, operation point $V_{out}$ of the amplifier 1 is maintained at the midpoint of the signal range. Also, the respective transistors illustrated in FIG. 2 are formed on the same wafer and through the same processes. Accordingly, when the lower limit voltage of the signal range of the amplifier 1 (i.e., $V_{th1}+V_{dsat2}$) becomes higher than a target level due to manufacturing variations etc., reference voltage $V_{ref}$ generated by the voltage generator circuit 3 similarly becomes higher than the target level. In other words, even when the characteristics of circuit elements vary due to manufacturing variations etc, operation point $V_{out}$ is maintained at the midpoint of the signal range. As a result of this, the amplitude of an output signal of the amplifier 1 is maximized even when there are variations in power supply voltages or manufacturing variations.

Second Embodiment

FIG. 6 illustrates an example of a voltage generator circuit included in an amplifier circuit according to the second embodiment. Note that the amplifiers 1 and the current generator circuits 4 are similar respectively between the first and second embodiments. Also, in the configuration illustrated in FIG. 6, current sources C1, C3 and C5 respectively generate current $I_b$, and current sources C2 and C4 respectively generate current $2I_b$.

In the second embodiment, the drain of transistor M11 is connected to current source C1, and the source of transistor M11 is grounded. Also, in transistor M11, the drain and the gate are connected to each other. In other words, transistor M11 operates as a diode. In this configuration, the size of transistor M11 is one fourth as large as that of tail transistor M2 of the amplifier 1. Accordingly, the voltage of node N1 is $V_{th2}+2V_{dsat2}$.

Power supply voltage $V_{dd}$ is applied to the drain of transistor M12, and the gate of transistor M12 is connected to node N1. Also, the source of transistor M12 is grounded via current source C2. The size of transistor M12 is equal to that of tail transistor M2. Accordingly, the voltage of node N2 is $V_{dsat2}$.

The drain of transistor M13 is connected to current source C3, and the source of transistor M13 is connected to node N2. Also, in transistor M13, the drain and the gate are connected to each other. The size of transistor M13 is four times as large as that of transistor M1 of the amplifier 1. Accordingly, the voltage of node N3 is $V_{dsat2}+V_{th1}+V_{dsat1}/2$.

Power supply voltage $V_{dd}$ is applied to the drain of transistor M14, and the gate of transistor M14 is connected to node N3. Also, the source of transistor M14 is grounded via current source C4. The size of transistor M14 is equal to that of transistor M1. Accordingly, the voltage of node N4 is $V_{dsat2}-V_{dsat1}/2$.

The drain of transistor M15 is connected to current source C5, and the source of transistor M15 is connected to node N4. Also, in transistor M15, the drain and the gate are connected to each other. The size of transistor M15 is four times as large as that of transistor M1 of the amplifier 1. Accordingly, the voltage of node N5 is $V_{th1}+V_{dsat2}$.

As described above, $V_{th1}+V_{dsat2}$ is generated at node N5. Then, the voltage generator circuit 3 outputs the voltage of node N5 as reference voltage $V_{ref}$. In other words, by the circuit illustrated in FIG. 6 as well, the lower limit voltage of the signal range of the amplifier 1 is generated similarly to the first embodiment. Note that the number of stages of the source follower is smaller in the second embodiment than in the first embodiment. Accordingly, drain-source voltages applied to the respective transistors are increased, leading to higher tolerance to variations in power supply voltages.

Third Embodiment

FIG. 7 illustrates an example of a voltage generator circuit included in an amplifier circuit according to the third embodiment. Note that the amplifier 1 and the current generator circuit 4 are similar respectively between the first and third embodiments. Also, in the configuration illustrated in FIG. 7, current sources C1 through C6 each generate current $I_b$.

In the third embodiment, the drain of transistor M11 is connected to current source C1, and the source of transistor M11 is grounded via current source C2. The drain of transistor M12 is connected to current source C3, and the source of transistor M12 is grounded. The gate of transistor M11 is connected to the drain of transistor M12 via node N2, and the gate of transistor M12 is connected to the source of transistor M11 via node N1. In this configuration, the size of each of transistors M11 and M12 is four times as large as that of transistor M1 of the amplifier 1. Also, the voltage of node N1 is $V_{th1}+V_{dsat1}/2$, and the voltage of node N2 is $2V_{th1}+V_{dsat1}$.

Power supply voltage $V_{dd}$ is applied to the drain of transistor M13, and the gate of transistor M13 is connected to node N2. Also, the source of transistor M13 is grounded via current source C4. The size of transistor M13 is equal to that of transistor M1. Accordingly, the voltage of node N3 is $V_{th1}$.

Current source C5, transistor M14, transistor M15 and current source C6 illustrated in FIG. 7 are similar respectively to current source C3, transistor M14, transistor M15 and current source C4 illustrated in FIG. 2. Accordingly, the voltage of node N4 is $V_{th1}+V_{th2}+2V_{dsat2}$, and the voltage of node N5 is $V_{th1}+V_{dsat2}$ in FIG. 7.

As described above, $V_{th1}+V_{dsat2}$ is generated in node N5. Then, the voltage generator circuit 3 outputs the voltage of node N5 as reference voltage $V_{ref}$. In other words, by the circuit illustrated in FIG. 7 as well, the lower limit voltage of the signal range of the amplifier 1 is generated similarly to the first embodiment. Note that a regulated cascode is formed in the third embodiment. This results in higher output resistance, leading to higher tolerance to variations in power supply voltages, than in the first embodiment.

Fourth Embodiment

Figure 8:
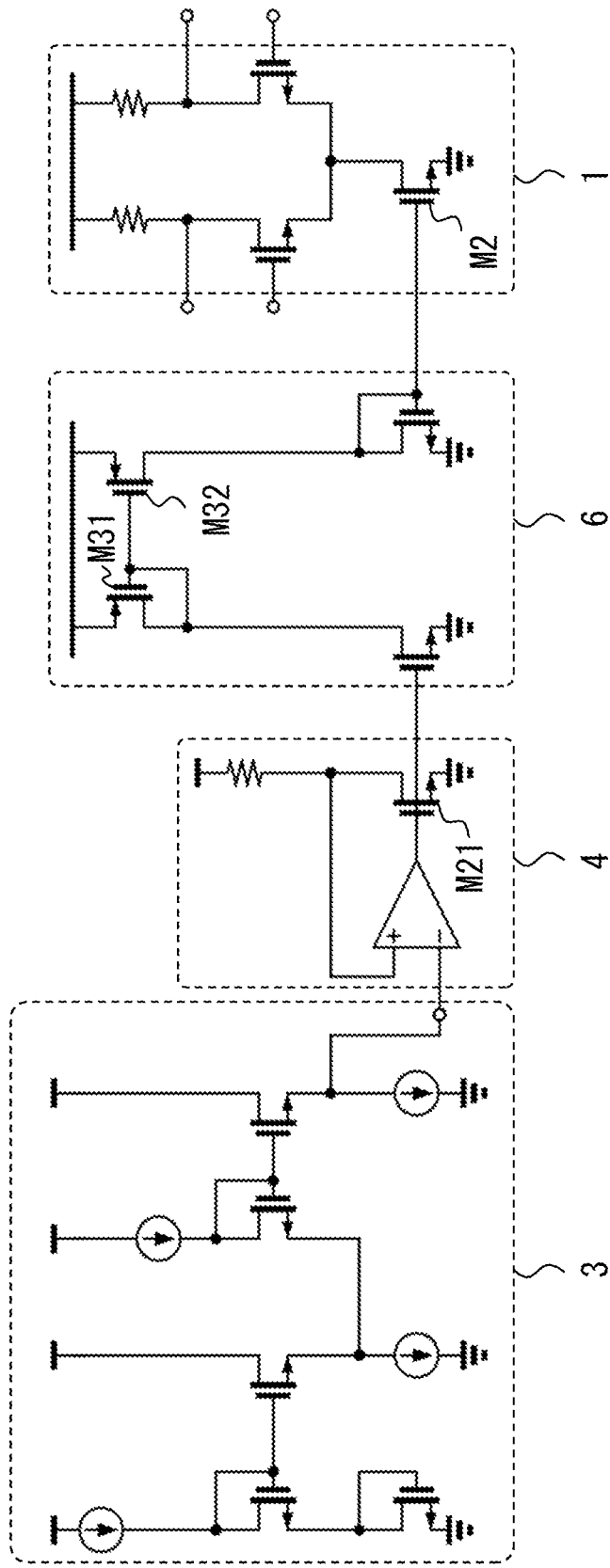
FIG. 8 illustrates an example of an amplifier circuit according to the fourth embodiment.

In the first embodiment illustrated in FIG. 2, transistor M21 included in the current generator circuit 4 is connected to tail transistor M2 of the amplifier 1. By contrast, in the fourth embodiment, a current mirror circuit 6 is provided between the current generator circuit 4 and the amplifier 1 as illustrated in FIG. 8. In other words, the current generator circuit 4 is electrically coupled to the amplifier 1 via the current mirror circuit 6.

The current ratio of the current mirror circuit 6 (i.e., a ratio between an input current and an output current of the current mirror circuit 6) is not particularly limited to a specific value. However, the current ratio of the current mirror circuit 6 is determined such that ratio n between a current that flows through transistor M21 and a current that flows through tail transistor M2 satisfies requirement 1, which is expressed by Formula 6 above. Note that the current ratio of the current mirror circuit 6 is determined by for example the size ratio between transistors M31 and M32.

According to this configuration, desired current can be generated easily. Note that the voltage generator circuit illustrated in FIG. 6 or FIG. 7 may be included instead of the voltage generator circuit 3 illustrated in FIG. 8.

Fifth Embodiment

Figure 9:
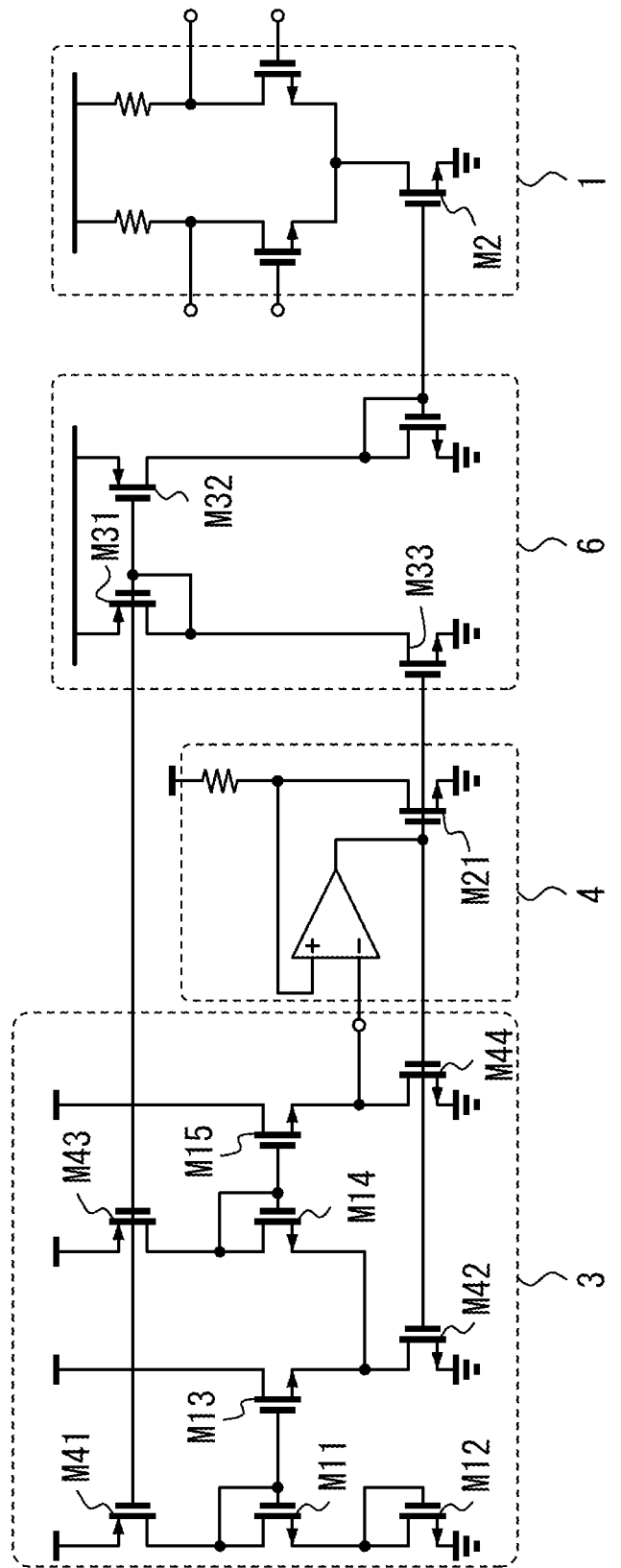
FIG. 9 illustrates an example of an amplifier circuit according to the fifth embodiment of the present invention.

FIG. 9 illustrates an example of an amplifier circuit according to the fifth embodiment of the present invention. In the fifth embodiment, transistors M41 through M44 are included respectively instead of current sources C1 through C4 illustrated in FIG. 2. Note that each of the gates of transistors M41, M43 and M31 is connected to one another as illustrated in FIG. 9. Each of the gates of transistors M42, M44, M21 and M33 is connected to one another.

In the above configuration, currents corresponding to a reference current generated by the current generator circuit 4 respectively flow through transistors M42 and M44. Also, transistors M41 and M43 are electrically coupled to the current generator circuit 4 via transistors M31 and M33 of the current mirror circuit 6. Thus, currents corresponding to a reference current generated by the current generator circuit 4 respectively flow through transistors M42 and M44 as well. In other words, in the fifth embodiment, a bias current of the voltage generator circuit 3 can be generated in the amplifier circuit 100 without using a current source. Note that it is desirable that transistors M41 through M44 be formed so as to make the ratios of currents that respectively flow through transistors M41, M42, M43 and M44 identical to the ratios of currents of current sources C1, C2, C3 and C4 illustrated in FIG. 2.

Note that while a bias current is generated in the amplifier circuit according to the first or fourth embodiment in the example illustrated in FIG. 9, the present invention is not limited to that configuration. In other words, a bias current may be generated in the amplifier circuit according to the second or third embodiment.

Sixth Embodiment

While the tail current source of the amplifier 1 is implemented by using a single transistor (tail transistor M2, specifically) in the first embodiment illustrated in FIG. 2, the present invention is not limited to that configuration. In other words, the tail current source of the amplifier 1 may be implemented by for example a cascode circuit.

Figure 10:
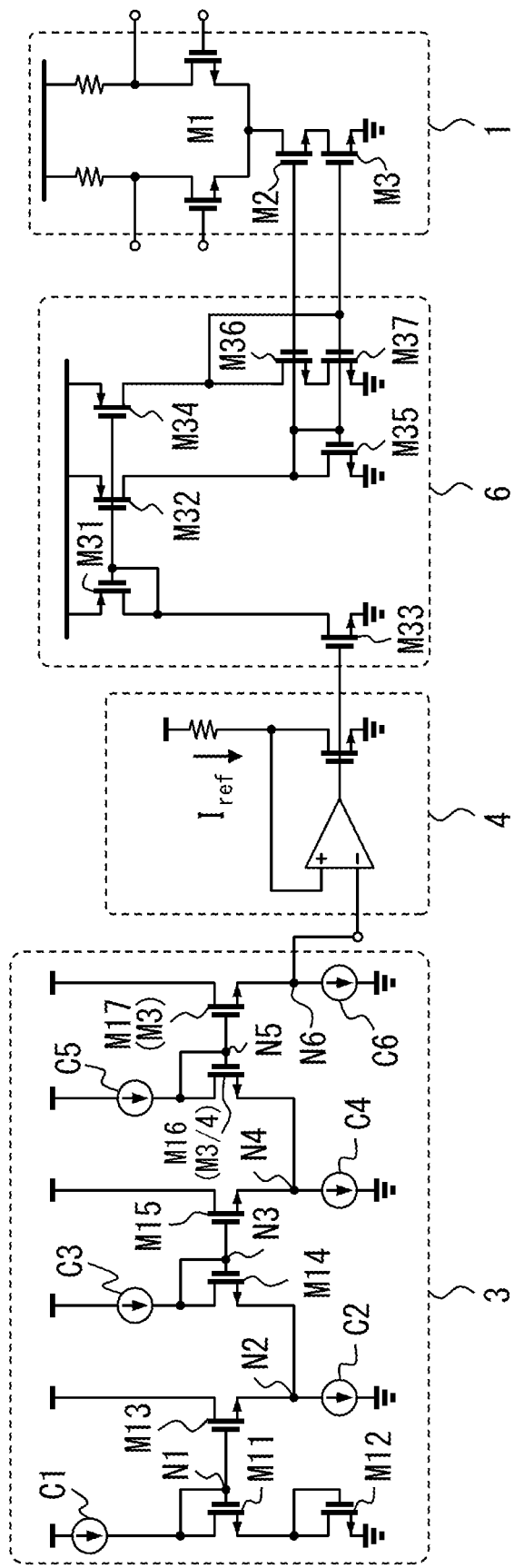
FIG. 10 illustrates an example of an amplifier circuit according to the sixth embodiment of the present invention.

FIG. 10 illustrates an example of an amplifier circuit according to the sixth embodiment of the present invention. In the example illustrated in FIG. 10, the tail current source of the amplifier 1 consists of transistors M2 and M3. The drain of transistor M2 is connected to differential transistor pair M1. The source of transistor M2 is connected to the drain of transistor M3. The source of transistor M3 is grounded.

In such a case, the lower limit voltage of the signal range of the amplifier 1 is higher, by a difference equivalent to the saturation drain voltage of transistor M3, than that in the first embodiment illustrated in FIG. 2. Specifically, in the configuration illustrated in FIG. 10, the lower limit voltage of the signal range of the amplifier 1 is $V_{th1}+V_{dsat2}+V_{dsat3}$. $V_{th1}$ represents the threshold voltage of transistor M1. $V_{dsat2}$ and $V_{dsat3}$ represent saturation drain voltages of transistors M2 and M3, respectively.

In the sixth embodiment, the voltage generator circuit 3 generates $V_{th1}+V_{dsat2}+V_{dsat3}$ because the lower limit voltage of the signal range of the amplifier 1 is $V_{th1}+V_{dsat2}+V_{dsat3}$. In this configuration, $V_{th1}+V_{dsat2}$ is generated by current sources C1 through C4 and transistors M11 through M15 illustrated in FIG. 2. That is, in the amplifier circuit illustrated in FIG. 10 as well, the voltage of node N4 is $V_{th1}+V_{dsat2}$. Thus, the voltage generator circuit 3 according to the sixth embodiment includes circuits (current sources C5 and C6 and transistors M16 and M17) for generating $V_{dsat3}$, in addition to current sources C1 through C4 and transistors M11 through M15.

The drain of transistor M16 is connected to current source C5. The current generated by current source C5 is $I_b$. The source of transistor M16 is connected to node N4. In transistor M16, the drain and the gate are connected to each other. The gate of transistor M17 is connected to the gate of transistor M16. Power supply voltage $V_{dd}$ is applied to the drain of transistor M17. The source of transistor M17 is grounded via current source C6. The current generated by current source C6 is $I_b$.

The voltage of node N4 is $V_{th1}+V_{dsat2}$ as explained by referring to FIG. 4. The size of transistor M16 is one fourth as large as that of tail transistor M3. Accordingly, the voltage of node N5 is $V_{th1}+V_{dsat2}+V_{th3}+2V_{dsat3}$. Also, the size of transistor M17 is equal to that of tail transistor M3. Accordingly, the voltage of node N6 is $V_{th1}+V_{dsat2}+V_{dsat3}$.

As described above, $V_{th1}+V_{dsat2}+V_{dsat3}$ is generated at node N6. Then, the voltage generator circuit 3 outputs the voltage of node N6 as reference voltage $V_{ref}$. The current generator circuit 4 generates reference current $I_{ref}$ in accordance with reference voltage $V_{ref}$. The current mirror circuit 6 includes transistors M31 through M37, and supplies currents corresponding to reference current $I_{ref}$ to transistors M2 and M3 of the amplifier 1. In this configuration, the amplitude of an output signal of the amplifier 1 is maximized even when the tail current source of the amplifier 1 is implemented by a cascode circuit.

In the example illustrated in FIG. 10, $V_{th1}+V_{dsat2}+V_{dsat3}$ is generated as reference voltage $V_{ref}$. Here, $V_{th1}$ represents the threshold voltage of each of the transistors constituting the differential transistor pair. Also, $V_{dsat2}$ and $V_{dsat3}$ respectively represent the saturation drain voltages of transistors M2 and M3, which constitutes a tail current source. In other words, in the sixth embodiment as well, the voltage generator circuit 3 generates a reference voltage that is determined based on the sum of the threshold voltage of a transistor in the differential transistor pair and the saturation drain voltage of the tail transistor.

Note that while the voltage generator circuit 3 is implemented based on the first or fourth embodiment in the example illustrated in FIG. 10, the present invention is not limited to that configuration. For example, a circuit that generates $V_{dsat3}$ may be added to the voltage generator circuit of the second embodiment illustrated in FIG. 6. Also, a circuit that generates $V_{dsat3}$ may be added to the voltage generator circuit of the third embodiment illustrated in FIG. 7.

Seventh Embodiment

While transistors in the differential transistor pair of the amplifier 1 are respectively implemented by an n-channel transistor in the example illustrated in FIG. 2, the present invention is not limited to that configuration. Specifically, the differential transistor pair of the amplifier 1 may also be implemented by p-channel transistors.

Figure 11:
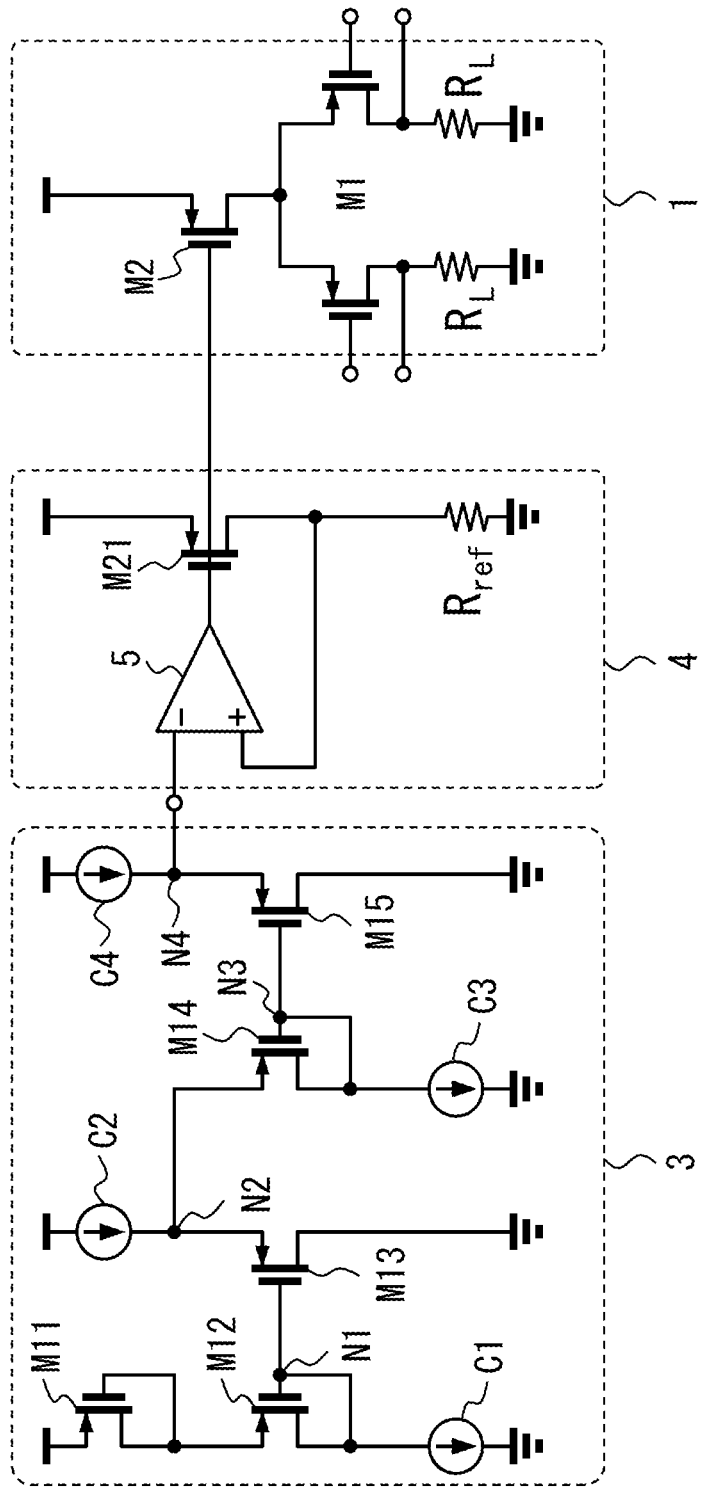
FIG. 11 illustrates an example of an amplifier circuit according to the seventh embodiment of the present invention.

FIG. 11 illustrates an example of an amplifier circuit according to the seventh embodiment of the present invention. The configuration of the amplifier circuit according to the seventh embodiment is similar to that of the first embodiment illustrated in FIG. 2. However, the transistors in the seventh embodiment are p-channel transistors.

The amplifier 1 includes load resistors $R_L$, a differential transistor pair M1 and tail transistor M2. Power supply voltage $V_{dd}$ is applied to the source of tail transistor M2. The drain of tail transistor M2 is connected to the sources the respective transistors in differential transistor pair M1. The drains of the respective transistors in differential transistor pair M1 are grounded via load resistors $R_L$. Accordingly, it is desirable that operation point $V_{out}$ of the amplifier 1 be $\{V_{dd}-(V_{dsat2}+V_{th1})\}/2$.

The voltage generator circuit 3 includes transistors M11 through M15 and current sources C1 through C4. Power supply voltage $V_{dd}$ is applied to the source of transistor M11. The drain of transistor M11 is connected to the source of transistor M12. The drain of transistor M12 is grounded via current source C1. In each of transistors M11 and M12, the source and the gate are connected to each other. The size of each of transistors M11 and M12 is four times as large as that of transistor M1. Accordingly, the voltage of node N1 is $V_{dd}-(2V_{th1}+V_{dsat1})$.

The source of transistor M13 is connected to current source C2, the gate of transistor M13 is connected to node N1, and the drain of transistor M13 is grounded. The size of transistor M13 is equal to that of transistor M1. Accordingly, the voltage of node N2 is $V_{dd}-V_{th1}$.

The source of transistor M14 is connected to node N2, and the drain of transistor M14 is grounded via current source C3. In transistor M14, the source and the gate are connected to each other. The size of transistor M14 is one fourth as large as that of tail transistor M2. Accordingly, the voltage of node N3 is $V_{dd}-V_{th1}-V_{th2}-2V_{dsat2}$.

The source of transistor M15 is connected to current source C4, the gate of transistor M15 is connected to node N3, and the drain of transistor M15 is grounded. The size of transistor M15 is equal to that of tail transistor M2. Accordingly, the voltage of node N4 is $V_{dd}-(V_{th1}+V_{dsat2})$.

As described above, $V_{dd}-(V_{th1}+V_{dsat2})$ is generated at node N4. Then, the voltage generator circuit 3 outputs the voltage of node N4 as reference voltage $V_{ref}$. In other words, the upper limit voltage of the signal range of the amplifier 1 is generated. The current generator circuit 4 generates reference current $I_{ref}$ in accordance with reference voltage $V_{ref}$. Reference current $I_{ref}$ is expressed by $V_{ref}/R_{ref}$. Then, a tail current corresponding to this reference current flows in the amplifier 1. As a result of this, the operation point of the amplifier 1 is controlled such that the amplitude of an output signal is maximized. Note that the differential transistor pair of the amplifier 1 may be formed of p-channel transistors in the second through sixth embodiments similarly to the configuration illustrated in FIG. 11.

Eighth Embodiment

Figure 12:
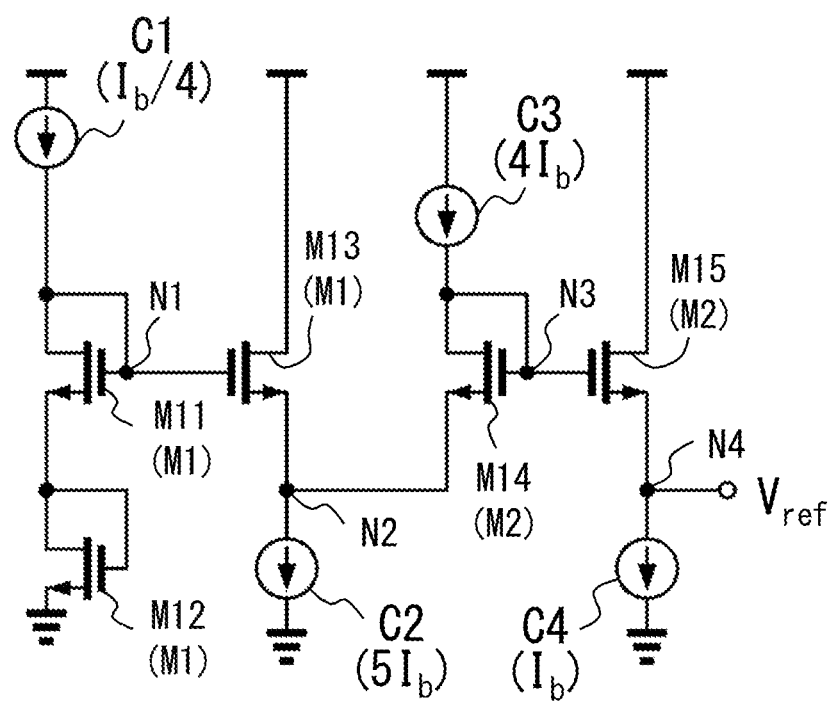
FIG. 12 illustrates an example of a voltage generator circuit included in an amplifier circuit according to the eighth embodiment.

FIG. 12 illustrates an example of a voltage generator circuit included in an amplifier circuit according to the eighth embodiment. Note that the amplifiers 1 and the current generator circuits 4 are similar respectively between the first and eighth embodiments.

The configurations of the voltage generator circuits 3 are similar between the first and eighth embodiments. However, a target voltage is generated by appropriately configuring the sizes of the transistors in the first embodiment. For example, a transistor of a size that is four times as large as that of transistor M1 is formed in order to generate a voltage that is half as high as the saturation drain voltage of transistor M1. Alternatively, a transistor of a size that is one fourth as large as that of tail transistor M2 is formed in order to generate a voltage that is twice as high as the saturation drain voltage of tail transistor M2.

In the eighth embodiment, a target voltage is generated by appropriately determining a bias current. In this embodiment, the saturation drain voltage of a transistor is expressed by Formula 13. L represents a channel length. W represents a gate width. μ represents the effective mobility of carriers. $C_{OX}$ represents an oxide film capacitor.

$$V_{dsat} = \sqrt{\frac{2I}{\frac{W}{L}\mu C_{OX}}} \qquad (13)$$

Accordingly, when the bias current is increased to four times, the saturation drain voltage is increased to twice.

Also, when the bias current is decreased to one fourth, the saturation drain voltage is decreased to half.

In the example illustrated in FIG. 12, currents generated by current sources C1, C2, C3 and C4 are $I_b/4$, $5I_b$, $4I_b$ and $I_b$, respectively. The size of each of transistors M11 through M13 is equal to that of each of the transistors constituting differential transistor pair M1. The size of each of transistors M14 and M15 is equal to that of tail transistor M2.

Because the bias current generated by current source C1 is $I_b/4$, the saturation drain voltage of each of transistors M11 and M12 is half as high as $V_{dsat1}$. In other words, the gate-source voltage of each of transistors M11 and 12 is $V_{th1}+V_{dsat1}/2$. Accordingly, the voltage of node N1 is $2V_{th1}+V_{dsat1}$, and the voltage of node N2 is $V_{th1}$.

Because, the bias current generated by current source C3 is $4I_b$, the saturation drain voltage of transistor M14 is twice as high as $V_{dsat2}$. In other words, the gate-source voltage of transistor M14 is $V_{th2}+^2V_{dsat2}$. Thus, the voltage of node N3 is $V_{th1}+V_{th2}+2V_{dsat2}$, and the voltage of node N4 is $V_{th1}+V_{dsat2}$.

As described above, by the configuration illustrated in FIG. 12 as well, the voltage generator circuit 3 can generate $V_{th1}+V_{dsat2}$. Accordingly, the operation point of the amplifier 1 is controlled such that the amplitude of an output signal is optimized. Note that $V_{th1}+V_{dsat2}$ may be generated by adjusting the bias current similarly in the second embodiment illustrated in FIG. 6 or the third embodiment illustrated in FIG. 7.

Ninth Embodiment

Figure 13:
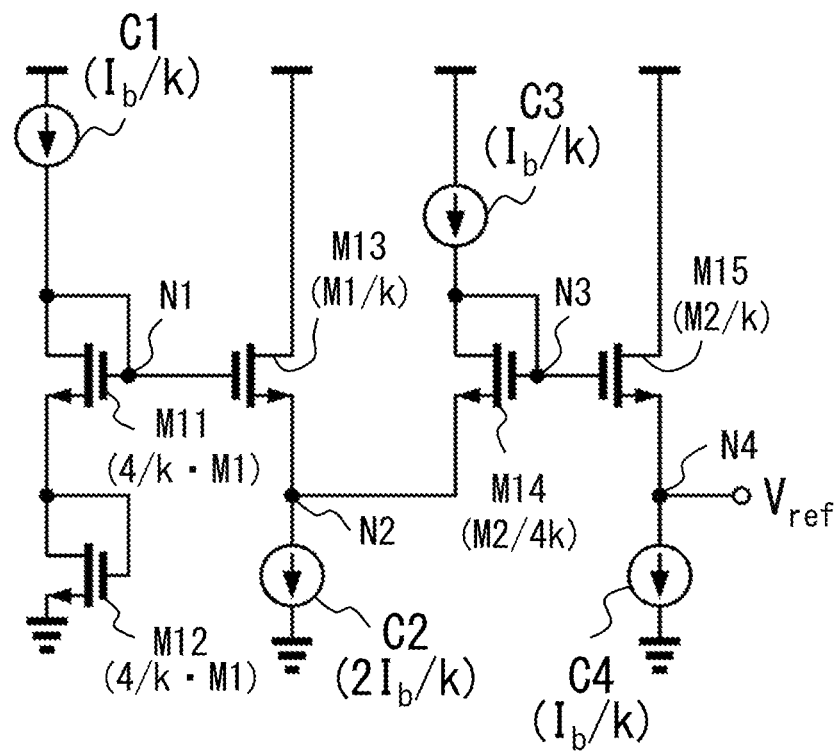
FIG. 13 illustrates an example of a voltage generator circuit included in an amplifier circuit according to the ninth embodiment.

FIG. 13 illustrates an example of a voltage generator circuit included in an amplifier circuit according to the ninth embodiment. Note that the amplifiers 1 and the current generator circuits 4 are similar respectively between the first and ninth embodiments.

The configuration of the voltage generator circuit 3 according to the ninth embodiment is similar to that of the first embodiment illustrated in FIG. 4. However, the size of each transistor and the bias current in the ninth embodiment are respectively 1/k those in the first embodiment. Specifically, the currents generated by current sources C1, C2, C3 and C4 are $I_b/k$, $2I_b/k$, $I_b/k$ and $I_b/k$, respectively. The size of each of transistors M11 and M12 is 4/k as large as that of transistor M1. The size of transistor M13 is 1/k as large as that of transistor M1. The size of transistor M14 is ¼k as large as that of tail transistor M2. The size of transistor M15 is 1/k as large as that of tail transistor M2. Note that k is a real number greater than one.

The saturation drain voltage of a transistor depends upon the size (the ratio between channel length L and gate width W) and the bias current of that transistor. Specifically, saturation drain voltage $V_{dsat}$ is expressed by Formula 14 below.

$$V_{dsat} = \sqrt{\frac{2I}{\frac{W}{L}\mu C_{OX}}} = \sqrt{\frac{2I/k}{\frac{1}{k}\cdot\frac{W}{L}\mu C_{OX}}} \quad (14)$$

Thus, even when the size and the bias current of a transistor are changed at the same ratio, the saturation drain voltage of that transistor does not change. In other words, even when the size of a transistor is reduced to 1/k and the bias current of the transistor is decreased to 1/k, saturation drain voltage $V_{dsat}$ of that transistor does not change. Note that "reduction of the size of a transistor to 1/k" is realized by for example reducing gate width W to 1/k without changing channel length L.

Therefore, the voltage of node N1 is $2V_{th1}+V_{dsat1}$ in the voltage generator circuit 3 illustrated in FIG. 13. The voltage of node N2 is $V_{th1}$. The voltage of node N3 is $V_{th1}+V_{th2}+2V_{dsat2}$. The voltage of node N4 is $V_{th1}+V_{dsat2}$.

As described above, by the configuration illustrated in FIG. 13 as well, the voltage generator circuit 3 generates $V_{th1}+V_{dsat2}$. Accordingly, the operation point of the amplifier 1 is controlled such that the amplitude of an output signal is optimized. In addition, the voltage generator circuit 3 is smaller in size and consumes less current in the ninth embodiment than in the first embodiment. Note that the size of each transistor may be reduced to 1/k and the bias current of each transistor may be decreased to 1/k in the second embodiment illustrated in FIG. 6 or the third embodiment illustrated in FIG. 7 as well.

Optical Module

The amplifier circuits 1 according to the first through ninth embodiments may be used for various applications. For example, the amplifier circuits 1 may be used for an optical module that transmits and receives optical signals.

Figure 14:
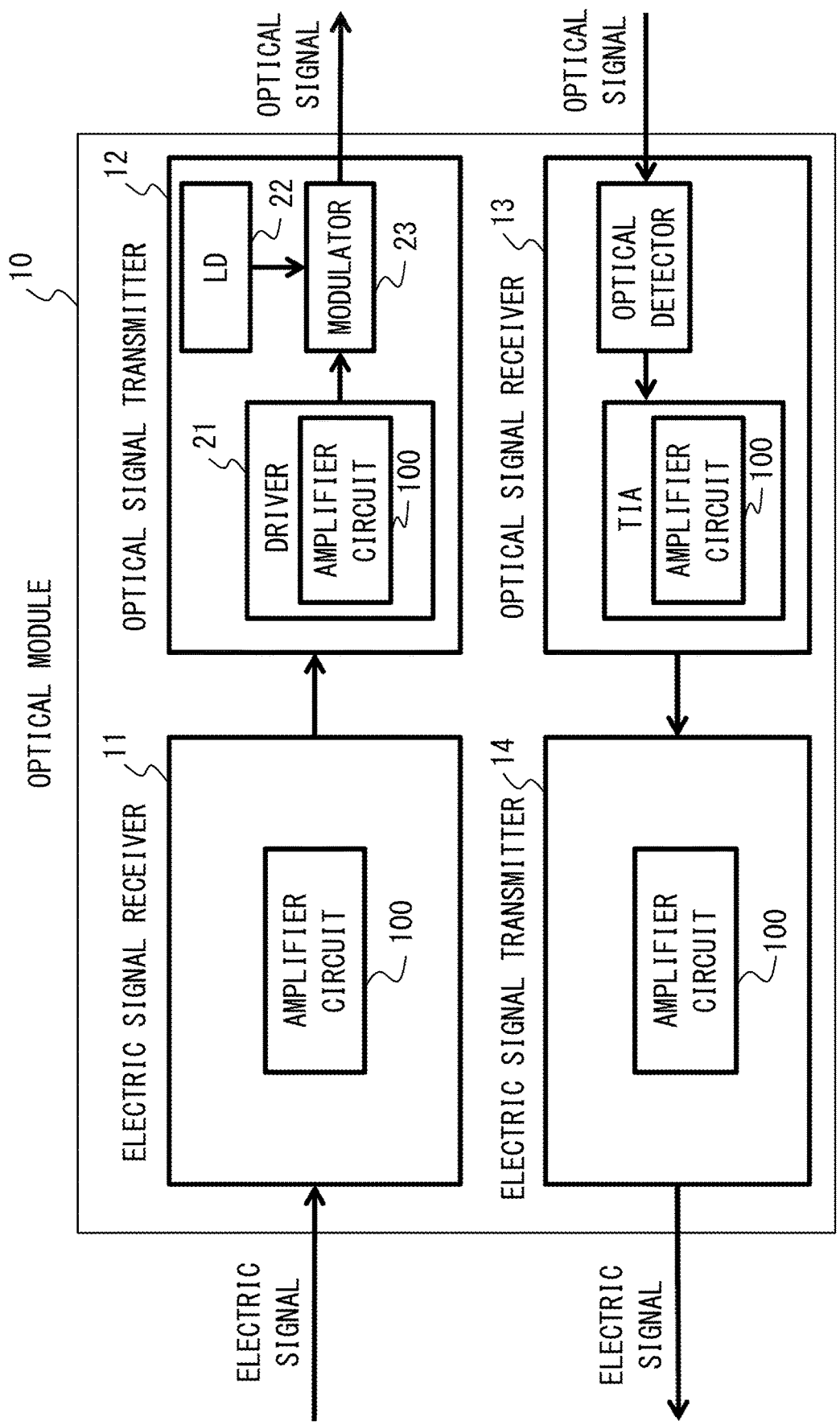
FIG. 14 illustrates an example of an optical module according to the embodiments of the present invention.

FIG. 14 illustrates an example of an optical module according to the embodiments of the present invention. This optical module 10 includes an electric signal receiver 11, an optical signal transmitter 12, an optical signal receiver 13 and an electric signal transmitter 14. The electric signal receiver 11, the optical signal transmitter 12, the optical signal receiver 13 and the electric signal transmitter 14 respectively include the amplifier circuit 100 according to the first through ninth embodiments, and generate differential drive signals by amplifying input signals.

In the optical module 10, the optical signal transmitter 12 includes a driver 21, a light source (LD) 22 and an optical modulator 23 for example. The driver 21 includes the amplifier circuit 100 according to the first through ninth embodiments, and generates a differential drive signal by amplifying an input data signal. The light source 22 generates continuous light of a prescribed wavelength. The optical modulator 23 generates a modulated optical signal by modulating continuous light with a differential drive signal supplied from the driver 21.

The amplifiers 1 according to the first through ninth embodiments can maximize the amplitude of an output signal as described above. Accordingly, the optical module 10 can generate a signal of high quality.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present inventions have been described in detail, it should be understood that the various changes, substitutions, and alterations could be made hereto without departing from the spirit and scope of the invention.

What is claimed is:
1. An amplifier circuit comprising:
an amplifier; and
a bias circuit configured to control an operation point of the amplifier, the amplifier includes:
a load resistor;
a differential transistor pair electrically coupled to the load resistor; and
a tail transistor electrically coupled to the differential transistor pair, and
the bias circuit includes:
a voltage generator circuit configured to generate a reference voltage corresponding to a sum of a threshold voltage of a transistor in the differential transistor pair and a saturation drain voltage of the tail transistor; and
a current generator circuit configured to generate a reference current that is proportional to a difference between a power supply voltage of the amplifier circuit and the reference voltage by using a reference resistor, and
the current generator circuit is electrically coupled to the amplifier such that a tail current that flows through the tail transistor is proportional to the reference current, and
the voltage generator circuit includes:
a first circuit configured to generate a first voltage that indicates $2V_{th1}+V_{dsat1}$;
a second circuit configured to generate a second voltage that indicates $V_{th1}$ based on the first voltage;
a third circuit configured to generate a third voltage that indicates $V_{th1}+V_{th2}+2V_{dsat2}$ based on the second voltage; and
a fourth circuit configured to generate the reference voltage that indicates $V_{th1}+V_{dsat2}$ based on the third voltage, and
$V_{th1}$ represents a threshold voltage of a transistor in the differential transistor pair,
$V_{dsat1}$ represents a saturation drain voltage of the transistor in the differential transistor pair,
$V_{th2}$ represents a threshold voltage of the tail transistor, and
$V_{dsat2}$ represents the saturation drain voltage of the tail transistor.

2. The amplifier circuit according to claim 1, wherein the first circuit includes a first transistor and a second transistor,
a size of the first transistor and a size of the second transistor are respectively four times as large as that of the transistor in the differential transistor pair, and
the first circuit outputs a sum of a gate-source voltage of the first transistor and a gate-source voltage of the second transistor as the first voltage.

3. The amplifier circuit according to claim 1, wherein the second circuit includes a third transistor,
a size of the third transistor is equal to that of the transistor in the differential transistor pair, and
the second circuit outputs a difference between the first voltage and a gate-source voltage of the third transistor as the second voltage.

4. The amplifier circuit according to claim 1, wherein the third circuit includes a fourth circuit,
a size of the fourth transistor is one fourth as large as that of the tail transistor, and
the third circuit outputs a sum of the second voltage and a gate-source voltage of the fourth transistor as the third voltage.

5. The amplifier circuit according to claim 1, wherein the fourth circuit includes a fifth transistor,
a size of the fifth transistor is equal to that of the tail transistor, and
the fourth circuit outputs a difference between the third voltage and a gate-source voltage of the fifth transistor as the reference voltage.

6. The amplifier circuit according to claim 1, wherein the load resistor includes a first load resistor and a second load resistor having resistance values that are equal to each other,
the differential transistor pair includes a first input transistor and a second input transistor having characteristics that are identical to each other, the first input transistor and the second input transistor being connected to the first load resistor and the second load resistor, respectively,
when the tail current that flows through the tail transistor is n times as high as the reference current, a resistance value of the reference resistor is n times as high as the resistance value of the first load resistor, and
n is a real number greater than zero.

7. An amplifier circuit comprising:
an amplifier; and
a bias circuit configured to control an operation point of the amplifier,
the amplifier includes:
a load resistor;
a differential transistor pair electrically coupled to the load resistor; and
a tail transistor electrically coupled to the differential transistor pair, and
the bias circuit includes:
a voltage generator circuit configured to generate a reference voltage corresponding to a sum of a threshold voltage of a transistor in the differential transistor pair and a saturation drain voltage of the tail transistor; and
a current generator circuit configured to generate a reference current that is proportional to a difference between a power supply voltage of the amplifier circuit and the reference voltage by using a reference resistor, and
the current generator circuit is electrically coupled to the amplifier such that a tail current that flows through the tail transistor is proportional to the reference current, and
the voltage generator circuit includes:
a first circuit configured to generate a first voltage that indicates $V_{th2}+2V_{dsat2}$,
a second circuit configured to generate a second voltage that indicates $V_{dsat2}$ based on the first voltage, a third circuit configured to generate
a third voltage that indicates $V_{dsat2}+V_{th1}+V_{dsat1}/2$ based on the second voltage,
a fourth circuit configured to generate a fourth voltage that indicates $V_{dsat2}-V_{dsat1}/2$ based on the third voltage, and
a fifth circuit configured to generate the reference voltage that indicates $V_{th1}+V_{dsat2}$ based on the fourth voltage, and
$V_{th1}$ represents a threshold voltage of a transistor in the differential transistor pair,
$V_{dsat1}$ represents a saturation drain voltage of the transistor in the differential transistor pair,
$V_{th2}$ represents a threshold voltage of the tail transistor, and
$V_{dsat2}$ represents the saturation drain voltage of the tail transistor.

8. An amplifier circuit according to claim 1, wherein comprising:

an amplifier; and
a bias circuit configured to control an operation point of the amplifier, the amplifier includes:
   a load resistor;
   a differential transistor pair electrically coupled to the load resistor; and
   a tail transistor electrically coupled to the differential transistor pair, and
the bias circuit includes:
   a voltage generator circuit configured to generate a reference voltage corresponding to a sum of a threshold voltage of a transistor in the differential transistor pair and a saturation drain voltage of the tail transistor; and
   a current generator circuit configured to generate a reference current that is proportional to a difference between a power supply voltage of the amplifier circuit and the reference voltage by using a reference resistor, and
the current generator circuit is electrically coupled to the amplifier such that a tail current that flows through the tail transistor is proportional to the reference current, and
the voltage generator circuit includes:
   a first circuit configured to generate a first voltage that indicates $V_{th1}+V_{dsat1}/2$,
   a second circuit configured to generate a second voltage that indicates $2V_{th1}+V_{dsat1}$ based on the first voltage,
   a third circuit configured to generate a third voltage that indicates $V_{th1}$ based on the second voltage,
   a fourth circuit configured to generate a fourth voltage that indicates $V_{th1}+V_{th2}+2V_{dsat2}$ based on the third voltage, and
   a fifth circuit configured to generate the reference voltage that indicates $V_{th1}+V_{dsat2}$ based on the fourth voltage, and
$V_{th1}$ represents a threshold voltage of a transistor in the differential transistor pair,
$V_{dsat1}$ represents a saturation drain voltage of the transistor in the differential transistor pair,
$V_{th2}$ represents a threshold voltage of the tail transistor, and
$V_{dsat2}$ represents the saturation drain voltage of the tail transistor.

9. An amplifier circuit comprising:
an amplifier; and
a bias circuit configured to control an operation point of the amplifier, the amplifier includes:
   a load resistor;
   a differential transistor pair electrically coupled to the load resistor; and
   a tail transistor electrically coupled to the differential transistor pair, and
the bias circuit includes:
   a voltage generator circuit configured to generate a reference voltage corresponding to a difference between a power supply voltage of the amplifier circuit and a sum of a threshold voltage of a transistor in the differential transistor pair and a saturation drain voltage of the tail transistor; and
   a current generator circuit configured to generate a reference current that is proportional to the reference voltage by using a reference resistor, and
the current generator circuit is electrically coupled to the amplifier such that a tail current that flows through the tail transistor is proportional to the reference current, and
the voltage generator circuit includes:
   a first circuit configured to generate a first voltage that indicates $V_{dd}-(2V_{th1}+V_{dsat1})$;
   a second circuit configured to generate a second voltage that indicates $V_{dd}-V_{th1}$ based on the first voltage;
   a third circuit configured to generate a third voltage that indicates $V_{dd}-V_{th1}-V_{th2}-2V_{dsat2}$ based on the second voltage; and
   a fourth circuit configured to generate the reference voltage that indicates $V_{dd}-(V_{th1}+V_{dsat2})$ based on the third voltage, and
$V_{th1}$ represents a threshold voltage of a transistor in the differential transistor pair,
$V_{dsat1}$ represents a saturation drain voltage of the transistor in the differential transistor pair,
$V_{th2}$ represents a threshold voltage of the tail transistor,
$V_{dsat2}$ represents the saturation drain voltage of the tail transistor, and
$V_{dd}$ represents the power supply voltage.

10. An optical module comprising:
a driver configured to generate a differential drive signal; and
an optical modulator configured to generate a modulated optical signal based on the differential drive signal,
the driver includes:
   an amplifier configured to generate the differential drive signal based on a data signal; and
   a bias circuit configured to control an operation point of the amplifier, and
the amplifier includes:
   a load resistor,
   a differential transistor pair that is electrically coupled to the load resistor, and
   a tail transistor that is electrically coupled to the differential transistor pair, and
the bias circuit includes:
   a voltage generator circuit configured to generate a reference voltage corresponding to a sum of a threshold voltage of a transistor in the differential transistor pair and a saturation drain voltage of the tail transistor, and
   a current generator circuit configured to generate a reference current that is proportional to a difference between a power supply voltage of the amplifier circuit and the reference voltage by using a reference resistor, and
the current generator circuit is electrically coupled to the amplifier such that a tail current that flows through the tail transistor is proportional to the reference current, and
the voltage generator circuit includes:
   a first circuit configured to generate a first voltage that indicates $2V_{th1}+V_{dsat1}$;
   a second circuit configured to generate a second voltage that indicates $V_{th1}$ based on the first voltage;
   a third circuit configured to generate a third voltage that indicates $V_{th1}+V_{th2}+2V_{dsat2}$ based on the second voltage; and
   a fourth circuit configured to generate the reference voltage that indicates $V_{th1}+V_{dsat2}$ based on the third voltage, and
$V_{th1}$ represents a threshold voltage of a transistor in the differential transistor pair,
$V_{dsat1}$ represents a saturation drain voltage of the transistor in the differential transistor pair,
$V_{th2}$ represents a threshold voltage of the tail transistor, and $V_{dsat2}$ represents the saturation drain voltage of the tail transistor.

* * * * *